(12) United States Patent
Miyazaki

(10) Patent No.: US 10,832,771 B2
(45) Date of Patent: Nov. 10, 2020

(54) SEMICONDUCTOR MEMORY DEVICE

(71) Applicant: TOSHIBA MEMORY CORPORATION, Tokyo (JP)

(72) Inventor: Takayuki Miyazaki, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/557,876

(22) Filed: Aug. 30, 2019

(65) Prior Publication Data

US 2020/0294583 A1    Sep. 17, 2020

(30) Foreign Application Priority Data

Mar. 14, 2019    (JP) .................................. 2019-047466

(51) Int. Cl.
*G11C 13/00*    (2006.01)

(52) U.S. Cl.
CPC ........ *G11C 13/003* (2013.01); *G11C 13/0026* (2013.01); *G11C 13/0028* (2013.01); *G11C 13/0038* (2013.01); *G11C 13/004* (2013.01); *G11C 13/0069* (2013.01); *G11C 2213/79* (2013.01)

(58) Field of Classification Search
CPC ............................. G11C 13/0069; G11C 7/22
USPC ............................................ 365/148, 189.05
See application file for complete search history.

(56) References Cited

U.S. PATENT DOCUMENTS

| | | | | |
|---|---|---|---|---|
| 5,587,960 A | * | 12/1996 | Ferris ....................... | G11C 5/14 365/189.02 |
| 5,668,770 A | * | 9/1997 | Itoh ....................... | G11C 11/412 257/903 |
| 5,936,892 A | * | 8/1999 | Wendell ................. | G11C 7/065 365/156 |
| 6,337,824 B1 | * | 1/2002 | Kono .................... | G11C 11/406 257/E27.097 |
| 8,971,093 B2 | | 3/2015 | Murooka | |
| 2003/0076705 A1 | * | 4/2003 | Yamaoka .............. | G11C 11/419 365/154 |
| 2003/0223276 A1 | * | 12/2003 | Yamaoka .............. | G11C 11/412 365/189.09 |

(Continued)

FOREIGN PATENT DOCUMENTS

| | | |
|---|---|---|
| JP | 2007-149170 A | 6/2007 |
| JP | 2013-030241 A | 2/2013 |
| JP | 2014-225314 A | 12/2014 |

*Primary Examiner* — Michael T Tran
(74) *Attorney, Agent, or Firm* — Kim & Stewart LLP

(57) ABSTRACT

A semiconductor memory device includes a first transistor connected between a high voltage line connected to a first end of a memory element and a first power supply terminal, and a second transistor connected between the high voltage line and a second power supply terminal, a third transistor connected between a low voltage line connected to a second end of the memory element and a third power supply terminal, and a fourth transistor connected between the low voltage line and a fourth power supply terminal. The second and fourth transistors satisfy the condition: |Vth|<|VG−VB|+VF, where Vth is a threshold voltage thereof, VG is a voltage difference between a gate and a source or drain thereof, VB is a bias voltage applied to a body thereof, and VF is a minimum voltage at which a parasitic diode current flows.

20 Claims, 8 Drawing Sheets

(56) References Cited

U.S. PATENT DOCUMENTS

| | | | |
|---|---|---|---|
| 2004/0212014 A1* | 10/2004 | Fujito | G11C 16/08 257/355 |
| 2005/0056825 A1* | 3/2005 | Bertin | H01L 29/0665 257/20 |
| 2006/0209585 A1* | 9/2006 | Tanizaki | G11C 13/0004 365/148 |
| 2007/0041242 A1* | 2/2007 | Okazaki | G11C 13/0002 365/154 |
| 2007/0121358 A1* | 5/2007 | Hirota | G11C 5/148 365/1 |
| 2007/0121371 A1* | 5/2007 | King | G11C 11/005 365/154 |
| 2007/0247885 A1* | 10/2007 | Watanabe | G11C 15/043 365/49.17 |
| 2009/0010041 A1* | 1/2009 | Afghahi | G11C 11/4091 365/149 |
| 2012/0075910 A1* | 3/2012 | Yasuda | G11C 13/0069 365/148 |
| 2012/0087172 A1* | 4/2012 | Aoki | G11C 13/003 365/148 |
| 2014/0008984 A1* | 1/2014 | Kamiyama | H02J 9/06 307/64 |
| 2014/0191328 A1* | 7/2014 | Tsuruta | H01L 21/823878 257/371 |
| 2014/0241042 A1* | 8/2014 | Park | G11C 29/021 365/148 |
| 2015/0092479 A1* | 4/2015 | Dong | G11C 13/0002 365/158 |
| 2015/0364193 A1* | 12/2015 | Shimakawa | G11C 13/0069 365/160 |
| 2018/0090501 A1* | 3/2018 | Yamakoshi | H01L 27/1203 |
| 2019/0013063 A1* | 1/2019 | Liu | G11C 11/412 |
| 2019/0279726 A1* | 9/2019 | Li | G11C 11/4085 |

* cited by examiner

SEMICONDUCTOR MEMORY DEVICE

CROSS-REFERENCE TO RELATED APPLICATION(S)

This application is based upon and claims the benefit of priority from Japanese Patent Application No. 2019-047466, filed Mar. 14, 2019, the entire contents of which are incorporated herein by reference.

FIELD

Embodiments described herein relate generally to a semiconductor memory device.

BACKGROUND

In recent years, a cross-point type memory in which a selector and a variable resistance element are disposed between a word line and a bit line, that extend in directions that intersect each other, to form a memory cell, has been proposed. The cross-point type memory includes one type in which memory cells are arranged in a plane in the form of a matrix, and another type in which memory cells are three-dimensionally arranged. The variable resistance element employed in the cross-point type memory changes its resistance, for example, when a high voltage pulse is applied thereto. By selectively applying a write voltage to a two-terminal memory element including a selector and a variable resistance element and by selectively applying a read voltage to the two-terminal memory element, a memory cell to be written or read (referred to herein as a selected memory cell) may be written or read bit by bit.

For such write or read of the two-terminal memory element, a MOS transistor is provided as a switch in a word line and a bit line and a voltage is selectively applied to the selected memory cell.

In the MOS transistor (e.g., an NMOS transistor), a pn junction between a channel region (e.g., a p-type semiconductor) and a source/drain region (e.g., an n-type semiconductor) may function as a parasitic diode. In the above-mentioned two-terminal memory element, when a voltage higher than a forward voltage is applied to the parasitic diode of the MOS transistor due to a timing deviation during the transition between a selected state and a non-selected state of the memory cell, a parasitic diode current may flow in the substrate.

DETAILED DESCRIPTION

Embodiments provide a semiconductor memory device which is capable of suppressing generation of a parasitic diode current.

In general, according to one embodiment, a semiconductor memory device includes a first selection circuit and a second selection circuit. The first selection circuit includes a first MOS transistor having a first terminal connected to a high voltage line that is connected to a first end of a two-terminal memory element and a second terminal connected to a first power supply voltage terminal, and a second MOS transistor having a first terminal connected to the high voltage line and a second terminal connected to a second power supply voltage terminal. The second selection circuit includes a third MOS transistor having a first terminal connected to a low voltage line that is connected to a second end of the two-terminal memory element and a second terminal connected to a third power supply voltage terminal and a fourth MOS transistor having a first terminal connected to the low voltage line and a second terminal connected to a fourth power supply voltage terminal. The second and fourth MOS transistors satisfy the condition of $|Vth| < |VG-VB| + VF$, where Vth is a threshold voltage thereof, VG is a voltage difference between a gate thereof and the second terminal thereof, VB is a bias voltage applied to a body thereof, and VF is a minimum voltage at which a parasitic diode that is between the body thereof and the first terminal thereof is turned on.

Hereinafter, embodiments of the present disclosure will be described in detail with reference to the accompanying drawings.

Embodiments of the present disclosure reliably suppress generation of a parasitic diode current (which is a current that flows when a voltage higher than a forward voltage is applied to a parasitic diode) regardless of a timing deviation of the transition between a selected state and a non-selected state by setting a threshold voltage of a MOS transistor that selectively applies a voltage to a memory cell including a two-terminal memory element (hereinafter, referred to as a two-terminal memory cell) based on the forward voltage of the parasitic diode.

Figure 1:
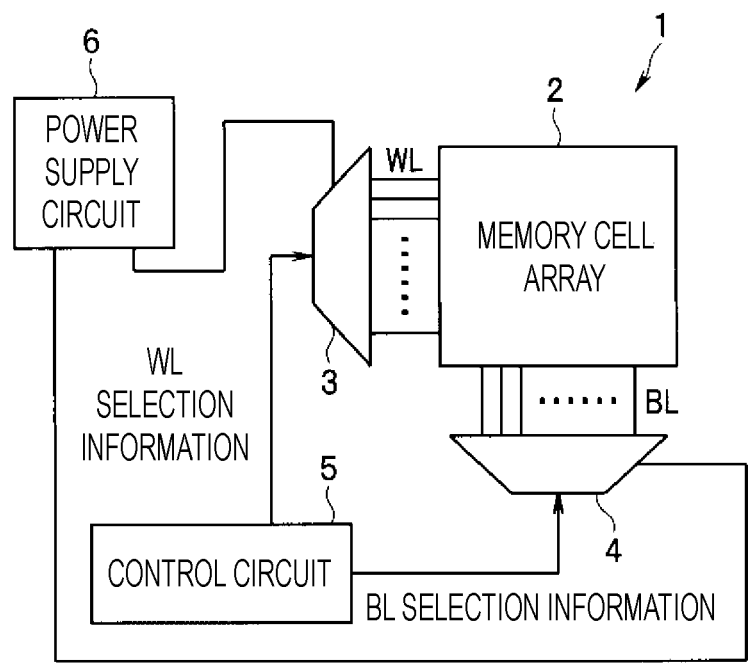
FIG. 1 is a block diagram illustrating an example of the overall configuration of a semiconductor memory device.

FIG. 1 is a block diagram illustrating an example of the overall configuration of a semiconductor memory device.

The semiconductor memory device 1 includes a memory cell array 2, a word line (WL) decoder 3, a bit line (BL) decoder 4, a control circuit 5 and a power supply circuit 6. The memory cell array 2 includes plural two-terminal memory cells arranged in the form of a matrix.

Figure 2:
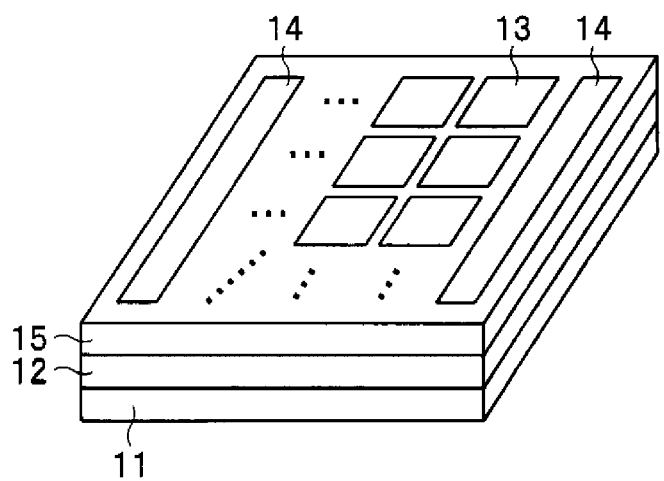
FIG. 2 is an explanatory view illustrating an example of the appearance of the memory device.

FIG. 2 is an explanatory view illustrating an example of the appearance of the memory device. A CMOS (complementary metal oxide semiconductor) circuit 12 including a wiring layer is formed using a well-known process on a semiconductor substrate (e.g., a silicon substrate) 11. A layer 15 including plural memory cells 13 is formed on the CMOS circuit 12. Each of the individual memory cells 13 of FIG. 2 corresponds to the memory cell array 2 of FIG. 1 and has, for example, wirings formed according to the design rule of 20 nm. A portion which is called a peripheral circuit including the decoders 3 and 4 and the control circuit 5 of FIG. 1 is provided in the CMOS circuit 12 of FIG. 2.

The CMOS circuit 12 may be designed/fabricated according to a 100 nm design rule, for example, which has lower processing difficulty than the memory cells 13, except when forming connections with the memory cells 13. The layer 15 has an electrical connection with the CMOS circuit around the memory cells 13. Blocks in units of the memory cells 13 and the connections are arranged in the form of a matrix. Moreover, through-holes (not illustrated) are formed in the layer 15. An input/output unit 14 includes terminals having an electrical coupling with an input/output unit of the CMOS circuit 12 via the through-holes and is formed, for example, on the end portion of the layer 15 or around the memory cells 13.

The memory cells 13 and the CMOS circuit 12 are coupled in the direction perpendicular to the substrate surface, so that the operation time may be reduced and the number of cells which may be read and written at the same time may be increased without increasing the chip area. In addition, it is possible to form a wiring lead-out pad on the input/output unit 14 of the device and bond the wiring lead-out pad to a lead frame in a packaging process.

Figure 3:
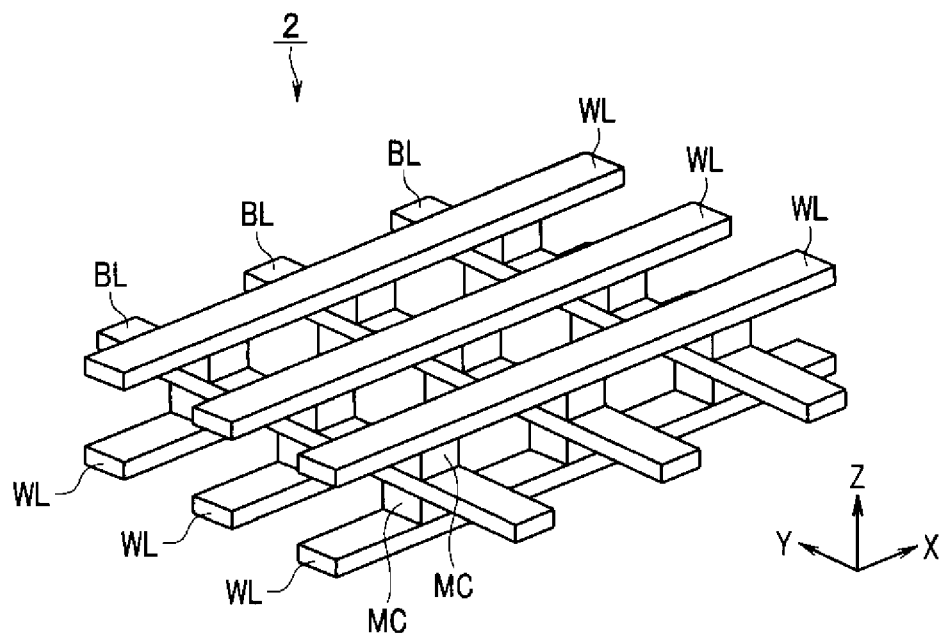
FIG. 3 is a view for explaining an example of the configuration of a memory cell array in the memory device.

FIG. 3 is a view for explaining an example of the configuration of the memory cell array 2. As illustrated in FIG. 3, plural word lines WL are formed in parallel along a first direction (X-direction) and plural bit lines are formed in parallel along a second direction perpendicular to the first direction (Y-direction). In FIG. 3, another set of word lines WL that are formed in parallel along the first direction, is arranged on the other side of the bit lines in a third direction (Z-direction). A two-terminal memory element MC is disposed between each word line WL and each bit line BL where the word line WL and the bit line BL overlap. One end of the two-terminal memory element MC is connected to the word line WL, and the other end thereof is connected to the bit line BL. FIG. 3 illustrates two stages (or levels) of two-terminal memory cells that are arranged in the form of a matrix in the Z-direction.

Figure 4:
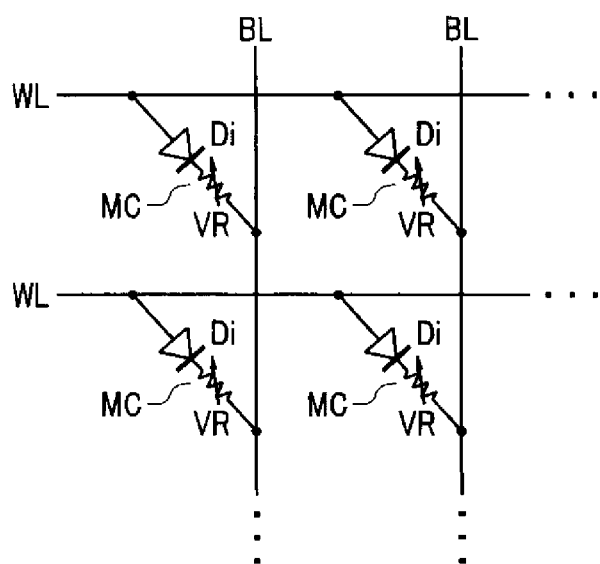
FIG. 4 is a circuit diagram illustrating an equivalent circuit of the memory cell array.

FIG. 4 is a circuit diagram illustrating an equivalent circuit of the memory cell array 2. Further, FIG. 4 illustrates only a portion of two-terminal memory cells arranged in the form of a matrix. As illustrated in FIG. 4, plural word lines WL arranged in parallel and plural bit lines BL arranged in parallel are arranged perpendicularly to each other. Two-terminal memory elements MC are disposed at corresponding overlapping locations of the word lines WL and the bit lines BL. Each of the two-terminal memory elements MC has one end connected to the corresponding word line WL and the other end connected to the corresponding bit line BL. When the two-terminal memory elements MC are disposed at the corresponding overlapping locations of the word lines WL and the bit lines BL, two-terminal memory cells are arranged in the form of a matrix.

Each two-terminal memory element MC includes a variable resistor VR and a selector Di that are connected with each other in series. The two-terminal memory element MC may have various other configurations. As for the selector Di, for example, a rectifier element may be employed to cause a predetermined current to flow when a predetermined voltage is applied, and a diode, a filament type ReRAM (Resistive Random Access Memory), an OTS (Ovonic Threshold Switch) or the like may be used.

As for the variable resistor VR, for example, an element is employed to cause a change in resistance value of metal oxide according to application conditions such as voltage, current, or heat, and store different states of the resistance value in a nonvolatile manner, as information. For example, as for the variable resistor VR, it is possible to use an element that changes a resistance value by the phase transition between a crystalline state and an amorphous state, such as chalcogenide (such as used in PCRAM), an element that changes a resistance value by forming a crosslink between electrodes by precipitating metal cations or breaking the crosslink by ionizing the precipitated metal (such as used in CBRAM: Conductive Bridging RAM), an element that changes a resistance value by application of a voltage or a current (such as used in ReRAM) (which is roughly divided into one where a resistance change occurs depending on the presence or absence of charges trapped in a charge trap layer at an electrode interface, and one where a resistance change occurs depending on the presence or absence of a conduction path caused by oxygen deficiency), or the like.

The control circuit 5 in FIG. 1 may include a processor such as a CPU or an FPGA, and operate according to a program stored in a memory (not illustrated) to control respective units, or may be implemented partially or entirely in a hardware electronic circuit. The control circuit 5 controls the WL decoder 3 and the BL decoder 4 to write write data received from an external host device (not illustrated) in the memory cell array 2 and output read data read from the memory cell array 2 to the external host device (not illustrated).

The power supply circuit 6 generates voltages required for write and read of the memory cell array 2 and supplies the generated voltages to the WL decoder 3 and the BL decoder 4. The WL decoder 3 is provided word line (WL) selection information used to write or read a predetermined two-terminal memory cell of the memory cell array 2 by the control circuit 5, and the BL decoder 4 is provided bit line (BL) selection information used to write or read a predetermined two-terminal memory cell of the memory cell array 2 by the control circuit 5.

The WL decoder 3 supplies a voltage based on the WL selection information to each word line WL, and the BL decoder 4 supplies a voltage based on the BL selection information to each bit line BL. A word line WL that is selected by the WL decoder 3 is referred to as a selected word line, and a word line WL that is not selected by the WL decoder 3 is referred to as a non-selected word line. A bit line BL that is selected by the BL decoder 4 is referred to as a selected bit line, and a bit line BL that is not selected by the BL decoder 4 is referred to as a non-selected bit line.

A two-terminal memory cell that is disposed at an overlapping location of the selected word line and the selected bit line is referred to as a selected memory cell, a two-terminal memory cell that is disposed at an overlapping location of the selected word line and the non-selected bit line or at an overlapping location of the non-selected word line and the selected bit line is referred to as a semi-selected memory cell, and a two-terminal memory cell that is disposed at an overlapping location of the non-selected word line and the non-selected bit line is referred to as an non-selected memory cell.

Figure 5:
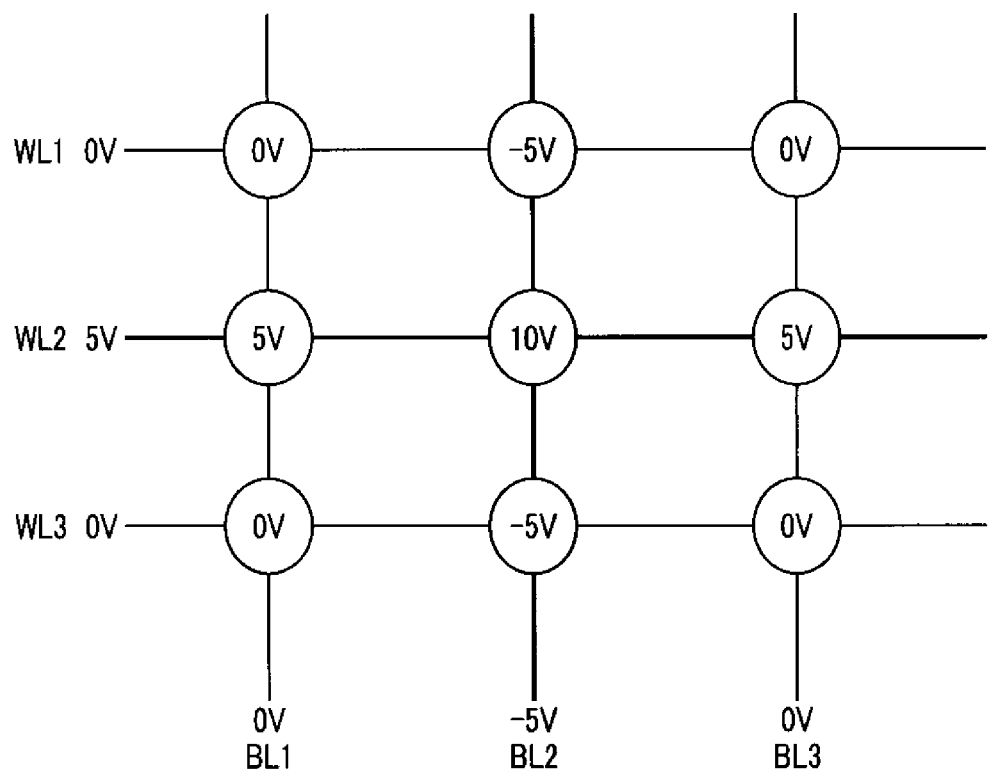
FIG. 5 illustrates a selected memory cell, a semi-selected memory cell and a non-selected memory cell during a write.
Figure 6:
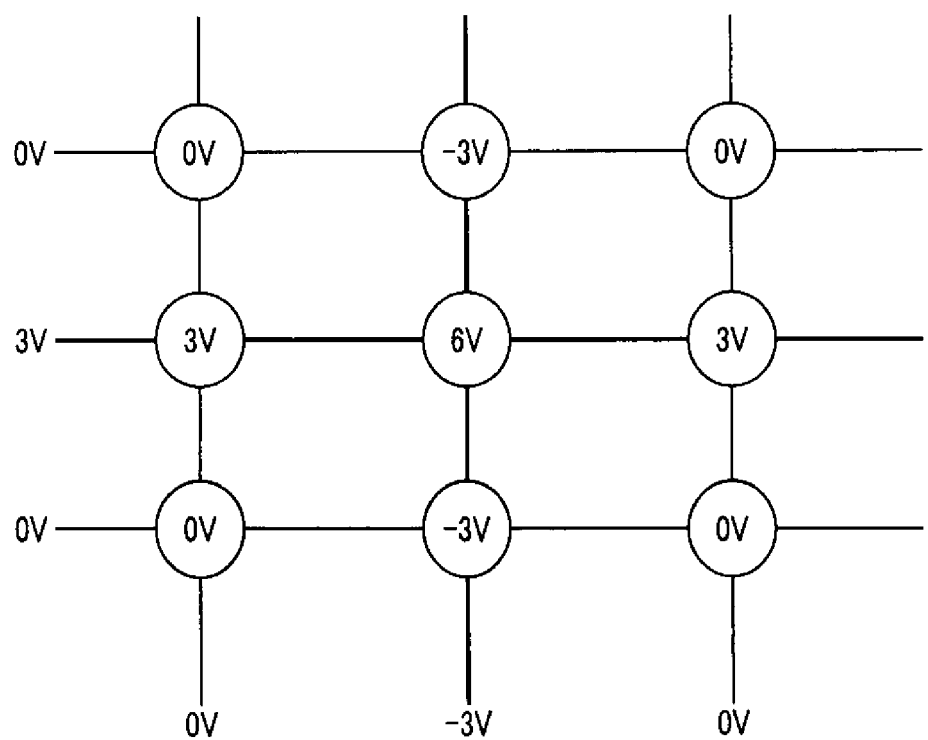
FIG. 6 illustrates a selected memory cell, a semi-selected memory cell and a non-selected memory cell during a read.

FIGS. 5 and 6 illustrate the state of a selected memory cell, a semi-selected memory cell and a non-selected memory cell, during a write and a read, respectively. In FIGS. 5 and 6, two-terminal memory cells disposed at intersections of horizontally extending word lines WL and vertically extending bit lines BL are enclosed by a circle.

It is assumed that the write of the variable resistor VR of the two-terminal memory element MC is performed by, for example, a pulse voltage higher than 6 V. In a case where a phase-change memory is employed as the variable resistor VR, the variable resistor VR may make a transition between an amorphous state (high resistance state) and a crystalline state (low resistance state) according to how the pulse voltage is changed. The selector Di of the two-terminal memory element MC has a threshold value of, for example, 5.5 V. The selector Di is turned on when a voltage equal to or higher than the threshold value is applied to the two-terminal memory element MC, and is turned off when the applied voltage is equal to or lower than a predetermined voltage lower than the threshold value. That is, the two-terminal memory element MC enters a selected state when a voltage equal to or higher than the threshold value is applied thereto by a word line WL and a bit line BL, and enters a non-selected state when a voltage equal to or lower than the predetermined voltage lower than the threshold value is applied thereto.

For example, as illustrated in FIG. 5, during writing, the WL decoder 3 applies 5 V to a selected word line WL2 and applies 0 V to non-selected word lines WL1 and WL3. In addition, the BL decoder 4 applies −5 V to a selected bit line BL2 and applies 0 V to non-selected bit lines BL1 and BL3. As a result, 10 V is applied to the two-terminal memory element MC so that a selected memory cell at the intersection of the selected word line and the selected bit line enters a selected state. In addition, as illustrated in FIG. 5, 5 V or −5 V is applied to a semi-selected memory cell and 0 V is applied to a non-selected memory cell. The two-terminal memory element MC of these memory cells has a non-selected state.

That is, in the example of FIG. 5, only the selector Di of a selected memory cell of the two-terminal memory element MC to which 10 V is applied is turned on so that a write is performed on the variable resistor VR. The two-terminal memory element MC of memory cells other than the selected memory cell is turned off (non-selected state) so that such a write is not performed.

As illustrated in FIG. 6, during reading, the WL decoder 3 applies 3 V to the selected word line WL2 and applies 0 V to the non-selected word lines WL1 and WL3. In addition, the BL decoder 4 applies −3 V to the selected bit line BL2 and applies 0 V to the non-selected bit lines BL1 and BL3. As a result, 6 V is applied to the two-terminal memory element MC at the selected memory cell disposed at the intersection of the selected word line and the selected bit line. In addition, as illustrated in FIG. 6, 3 V or −3 V is applied to the semi-selected memory cell and 0 V is applied to the non-selected memory cell.

Even in the example of FIG. 6, only the selector Di of a selected memory cell of the two-terminal memory element MC to which 6 V is applied is turned on (selected state) so that a read is performed on the variable resistor VR. Although 6 V is applied to the variable resistor VR of the selected memory cell, no write is performed at the voltage of 6 V, and the resistance value of the variable resistor VR is maintained. The two-terminal memory element MC of memory cells other than the selected memory cell is turned off (non-selected state) so that read is not performed.

That is, the selected state of the two-terminal memory element MC is a state where a word line WL becomes a selected word line, a bit line BL becomes a selected bit line, a voltage at which the selector Di is made conductive is applied to the two-terminal memory element MC, and write or read of the two-terminal memory element MC is made possible. Conversely, the non-selected state of the two-terminal memory element MC is a state where a word line WL becomes a non-selected word line, a bit line BL becomes a non-selected bit line, a voltage at which the selector Di is made non-conductive is applied to the two-terminal memory element MC, and write or read of the two-terminal memory element MC is made impossible.

Although the example of FIGS. 5 and 6 illustrates that the two-terminal memory element MC is driven by supplying a high voltage to a word line WL and a low voltage to a bit line BL, a low voltage may be applied to the word line WL and a high voltage may be applied to the bit line BL. Therefore, instead of the terms "word line WL" and "bit line BL", a line that applies a high voltage to the two-terminal memory element MC may be referred to as a high voltage line and a line that applies a low voltage to the two-terminal memory element MC may be referred to as a low voltage line.

Figure 7:
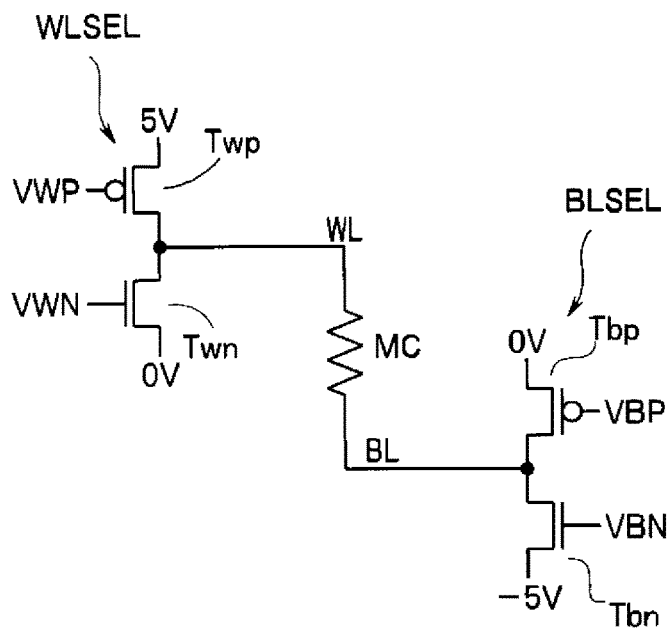
FIG. 7 is a circuit diagram illustrating an example of a specific configuration of a word line decoder and a bit line decoder of the memory device.

FIG. 7 is a circuit diagram illustrating an example of a specific configuration of the WL decoder 3 and the BL decoder 4. The WL decoder 3 has plural word line selection circuits WLSEL provided for respective word lines WL, and the BL decoder 4 has plural bit line selection circuits BLSEL provided for respective bit lines BL. FIG. 7 illustrates one word line selection circuit WLSEL provided for a predetermined word line WL, one bit line selection circuit BLSEL provided for a predetermined bit line BL, and one two-terminal memory element MC driven by these circuits.

The word line selection circuit WLSEL includes a PMOS transistor Twp and an NMOS transistor Twn having a source/drain path formed between a power supply line that supplies a power supply voltage of 5 V and a power supply line that supplies a power supply voltage of 0 V from the power supply circuit 6. The bit line selection circuit BLSEL includes a PMOS transistor Tbp and an NMOS transistor Tbn having a source/drain path formed between a power supply line that supplies a power supply voltage of 0 V and a power supply line that supplies a power supply voltage of −5 V from the power supply circuit 6. Gate voltages VWP, VWN, VBP and VBN are supplied to the gates of the transistors Twp, Twn, Tbp and Tbn, respectively.

The descriptions of the transistor Twn and the transistor Tbp may be complicated when the names "source" and "drain" are used according to the voltage of a terminal. Therefore, in the following descriptions, for the transistors Twp and Twn, a terminal connected to the word line WL is referred to as a first terminal, and a terminal connected to the power supply line is referred to as a second terminal. For the transistors Tbp and Tbn, a terminal connected to the bit line BL is referred to as a first terminal, and a terminal connected to the power supply line is referred to as a second terminal.

The word line WL becomes a selected word line when the word line selection circuit WLSEL applies, for example, 5 V to the word line WL, and becomes a non-selected word line when the word line selection circuit WLSEL applies, for example, 0 V to the word line WL. The bit line BL becomes a selected bit line when the bit line selection circuit BLSEL applies, for example, −5 V to the bit line BL, and becomes a non-selected bit line when the bit line selection circuit BLSEL applies, for example, 0 V to the bit line BL.

Figure 8:
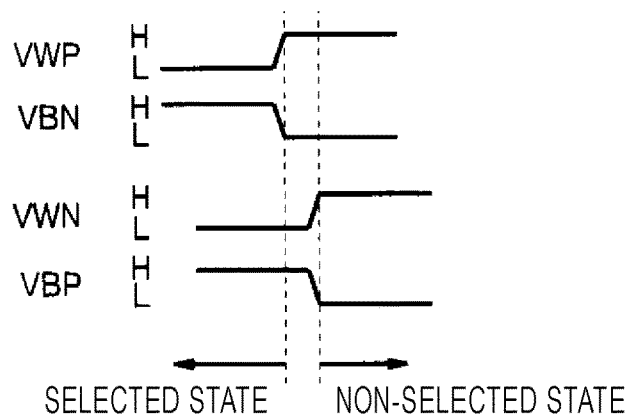
FIG. 8 is a timing chart illustrating gate voltages applied to transistors of a word line selection circuit and a bit line selection circuit.

FIG. 8 is a timing chart illustrating changes in the gate voltages VWP, VWN, VBP and VBN applied to the transistors Twp, Twn, Tbp and Tbn, respectively. At this time, it is assumed that, in the left side of FIG. 8, the gate voltages VWP and VWN are at a low level (L) and the gate voltages VBP and VBN are at a high level (H). In this case, the transistors Twp and Tbn are turned on and the transistors Twn and Tbp are turned off. Therefore, 5 V is applied to the word line WL so that the word line WL becomes a selected word line, −5 V is applied to the bit line BL so that the bit line BL becomes a selected bit line, and the two-terminal memory element MC is in a selected state.

It is assumed that, in the right side of FIG. 8, the gate voltages VWP and VWN are at the H state and the gate voltages VBP and VBN are at the L state. In this case, the transistors Twp and Tbn are turned off and the transistors Twn and Tbp are turned on. Therefore, 0 V is applied to the word line WL so that the word line WL becomes a non-selected word line, 0 V is applied to the bit line BL so that the bit line BL becomes a non-selected bit line, and the two-terminal memory element MC is in a non-selected state.

In the central side of FIG. 8, all the transistors Twp, Twn, Tbp and Tbn are turned off to prevent a through-current from flowing into the word line selection circuit WLSEL and the bit line selection circuit BLSEL. In this manner, the state of FIG. 8 is an example in a case where the timing control of the supply of the gate voltages is normally performed at the transition from the selected state to the non-selected state.

In the example of FIG. 7, the high voltage is applied to the word line WL and the low voltage is applied to the bit line BL to select the two-terminal memory element MC. However, the low voltage may be applied to the word line WL and the high voltage may be applied to the bit line BL to select the two-terminal memory element MC. Therefore, among the four transistors of the word line selection circuit WLSEL and the bit line selection circuit BLSEL, a transistor through which a high voltage is supplied to the two-terminal memory element MC for the two-terminal memory element MC to enter a selected state is referred to as a high voltage line selected transistor (the transistor Twp in FIG. 7), and a transistor through which a zero voltage is supplied to the two-terminal memory element MC for the two-terminal memory element MC to enter a non-selected state is referred to as a high voltage line non-selected transistor (the transistor Twn in FIG. 7). Among the four transistors of the word line selection circuit WLSEL and the bit line selection circuit BLSEL, a transistor through which a low voltage is supplied to the two-terminal memory element MC for the two-terminal memory element MC to enter a selected state is referred to as a low voltage line selected transistor (the transistor Tbn in FIG. 7), and a transistor through which a zero voltage is supplied to the two-terminal memory element MC for the two-terminal memory element MC to enter a non-selected state is referred to as a low voltage line non-selected transistor (the transistor Tbp in FIG. 7).

(Problem)

Figure 9:
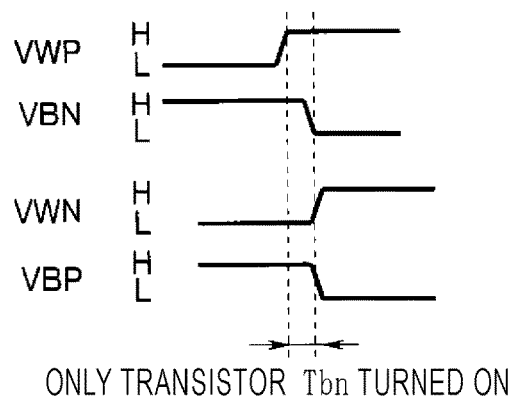
FIG. 9 is a timing chart illustrating a mismatch in the timing of applying the gate voltages to the transistors of the word line selection circuit and the bit line selection circuit.

Although the example of the normal timing control is illustrated in FIG. 8, the timing control may be deviated by several milliseconds for various reasons. FIG. 9 is a timing chart illustrating changes in the timing of the gate voltages VWP, VWN, VBP and VBN in this case. FIG. 9 illustrates that the timing at which the gate voltage VBN changes from H to L is slightly delayed as compared to the normal state at the time of transition from the selected state to the non-selected state of FIG. 8.

In the present embodiment, the transistor Twn and the transistor Tbp are employed as the high voltage line non-selected transistor and the low voltage line non-selected transistor. Descriptions will be made below on the problem when these transistors are not employed as the high voltage line non-selected transistor (the transistor Twn in FIG. 7) or the low voltage line non-selected transistor (the transistor Tbp in FIG. 7).

Figure 10:
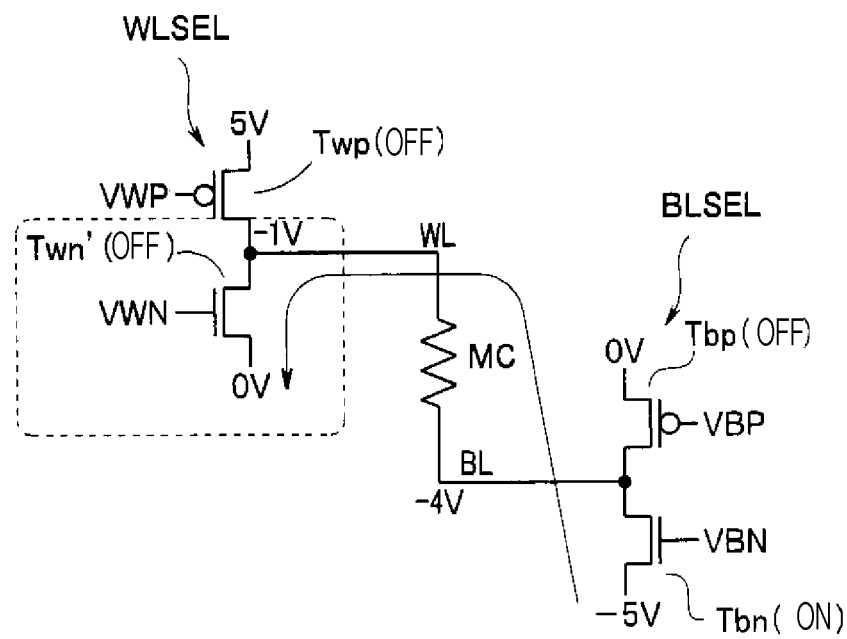
FIG. 10 is a conceptual diagram illustrating a problem introduced by the mismatch in the timing of applying the gate voltages to the transistors of the word line selection circuit and the bit line selection circuit.

FIG. 10 is a conceptual diagram illustrating a problem in a case where the transistor Twn' replaces the transistor Twn. When the timing delay of FIG. 9 occurs, the timing at which the transistor Tbn is turned off is slightly delayed, and in the circuit of FIG. 10, there is a period in which the transistors Twp, Twn' and Tbp are turned off but the transistor Tbn remains turned on.

The selector Di of the two-terminal memory element MC has a characteristic that once turned on, the selector Di is not turned off until the terminal voltage falls below a predetermined voltage value. Therefore, the selector Di is not always in the off state from the selected state until the transistors Twn' and Tbp are both turned on to be in the non-selected state. When only the transistor Tbn is turned on, as indicated by an arrow in FIG. 10, according to a voltage applied to the second terminal of the transistor Tbn and a voltage applied to the first terminal of the transistor Twn', a voltage difference occurs between the second terminal and the first terminal of the transistor Twn', and a parasitic diode is formed between the substrate and the first terminal. As a result, the second terminal and the first terminal of the transistor Twn' are electrically connected via the parasitic diode, and a current flows from the second terminal of the transistor Twn' to the second terminal of the transistor Tbn via the parasitic diode, the word line WL, the two-terminal memory element MC and the transistor Tbn. The first terminal of the transistor Twn' is at, for example, −1 V according to the forward voltage of the parasitic diode.

Figure 11:
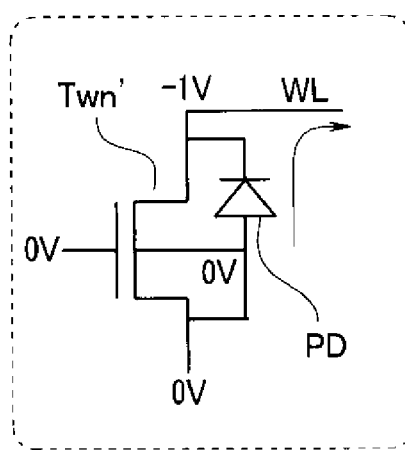
FIG. 11 is an equivalent circuit of one of the transistors enclosed by a broken line in FIG. 10.

FIG. 11 is an equivalent circuit of the transistor Twn' surrounded by a broken line in FIG. 10. As illustrated in FIG. 11, a parasitic diode PD is formed in the transistor Twn', and a current indicated by an arrow may flow according to a voltage across both terminals of the parasitic diode PD.

Thus, the timing deviation may cause a parasitic diode current due to the parasitic diode in the transistor Twn'. In a case where the timing at which the transistor Twp is turned on is slightly earlier than that of the transistor Tbn for the same reason, when the transistor Twn' is employed as the low voltage line non-selected transistor, the parasitic diode in the transistor may generate a parasitic diode current. In FIGS. 9 to 11, although descriptions have been made on the parasitic diode current which may occur when transitioning from the selected state to the non-selected state, even when transitioning from the non-selected state to the selected state, only the high voltage line selected transistor or only the low voltage line selected transistor may be turned on due to the timing deviation, thereby generating a parasitic diode current due to the parasitic diode in the high voltage line non-selected transistor or the low voltage line non-selected transistor.

Solution

In the present embodiment, a transistor that satisfies the condition represented by the following equation (1) is adopted as the high voltage line non-selected transistor, and a transistor that satisfies the condition represented by the following equation (2) is adopted as the low voltage line non-selected transistor.

It is also conceivable to set a bias voltage applied to a body of the transistor (hereinafter referred to as "substrate voltage") so that no parasitic diode current occurs in the high voltage line non-selected transistor and the low voltage line non-selected transistor. For example, for the high voltage line non-selected transistor, the substrate voltage may be set sufficiently lower than the voltage of the first terminal. However, this method requires that an element having a sufficiently high breakdown voltage be adopted as the high voltage line non-selected transistor and the low voltage line non-selected transistor. The breakdown voltage of the transistor may be changed according to the structure of the transistor such as a gate insulating film, an intersection forming a parasitic diode, a gate width, and a gate length. However, increasing the breakdown voltage of the transistor may result in an increase in the size of the transistor.

Therefore, in the present embodiment, the conditions (1) and (2) are set to avoid the above-mentioned problem while adopting an element having a relatively low breakdown voltage, that is, an element having a breakdown voltage lower than a difference voltage between the high voltage line and the low voltage line, as the high voltage line non-selected transistor and the low voltage line non-selected transistor.

When the following condition (1) is satisfied, as will be described later, in the state of FIG. 9, the high voltage line non-selected transistor may be turned on (the channel is turned on) before the parasitic diode is turned on, thereby preventing generation of a parasitic diode current. Similarly, when the following condition (2) is satisfied, generation of a parasitic diode current may be prevented in the low voltage line non-selected transistor.

$$Vthn < VG - VB + VF \tag{1}$$

$$Vthp > VG - (VB + VF) \tag{2}$$

In the equation (1), the symbols "Vthn", "VG", "VB" and "VF" are a threshold voltage of the high voltage line non-selected transistor, a voltage difference between the gate and the second terminal, a substrate voltage, and a parasitic diode forward voltage, respectively.

In the equation (2), the symbols "Vthp", "VG", "VB" and "VF" are a threshold voltage of the low voltage line non-selected transistor, a voltage difference between the gate and the second terminal, a substrate voltage, and a parasitic diode forward voltage, respectively.

The threshold voltage of the transistor may be changed according to the material of the gate, the impurity concentration of the channel, and the like.

In general, the forward current of a diode is defined by the following equation (3). In the present embodiment, the forward voltage VF is a voltage required to turn on the parasitic diode. In the present embodiment, a bias voltage necessary for causing a current having the same magnitude as the drain current flowing to the transistor to flow to the parasitic diode in the state where the same gate-source voltage as the threshold voltage is applied is defined as a forward voltage VF.

$$i = I_s(e^{v/\eta V_T} - 1) \tag{3}$$

Originally, the high voltage line non-selected transistor is supplied with a high voltage to the first terminal and a low voltage to the second terminal, and may be turned off to set the high voltage line to the selected state (selected word line) when the gate voltage is at L and may be turned on to set the high voltage line to the non-selected state (non-selected word line) when the gate voltage is at H. In the meantime, in the present embodiment, the condition of turning on the high voltage line non-selected transistor is set in consideration of a case where the first terminal has a voltage lower than that of the second terminal. In this case, the condition under which the high voltage line non-selected transistor is turned on is expressed by the following equation (4).

$$VG - V1 - Vthn > 0 \tag{4}$$

V1 is the voltage of the first terminal. In the meantime, the condition under which the parasitic diode is not turned on in this high voltage line non-selected transistor is expressed by the following equation (5).

$$V1 > VB - VF \tag{5}$$

By modifying the equations (4) and (5), the equation (1) is obtained. In the present embodiment, it is sufficient to select a high voltage line non-selected transistor whose threshold voltage Vthn satisfies the above equation (1).

The above equation (1) means that VB−VF<VG−Vthn. From the selected state of FIG. 9, that is, a state where the high voltage line non-selected transistor and its parasitic diode are all turned off according to the relation of V1>VG−Vthn and V1>VB−VF, even when the word line WL has a negative voltage and V1 starts to decrease as illustrated in FIG. 10, VG−Vthn always becomes larger than V1 earlier than VB−VF. That is, the high voltage line non-selected transistor is turned on before the parasitic diode is turned on. Then, the voltage V1 of the first terminal maintains the voltage of the second terminal (V2−Vthn), and does not decrease further. Therefore, V1<VB−VF does not occur, and the parasitic diode remains turned off.

When it is assumed that the gate voltage VG is 0 V (=VS (voltage of the second terminal)), it is sufficient to select a high voltage line non-selected transistor which satisfies the following equation (6).

$$Vthn < -VB + VF \tag{6}$$

Under this assumption, the voltage of the second terminal may be applied to the gate, and there is an advantage that it is not necessary to separately provide a power supply for the gate voltage.

Further, when it is assumed that the substrate voltage VB is 0 V, a high voltage line non-selected transistor satisfying the following equation (7) may be selected.

$$Vthn < VF \tag{7}$$

In the meantime, originally, the low voltage line non-selected transistor is supplied with a low voltage to the first terminal and a high voltage to the second terminal, and may be turned off to set the low voltage line to the selected state (selected bit line) when the gate voltage is at H and may be turned on to set the low voltage line to the non-selected state (non-selected bit line) when the gate voltage is at L.

In contrast, in the present embodiment, the condition of turning on the low voltage line non-selected transistor is set in consideration of a case where the first terminal has a voltage higher than that of the second terminal. In this case, the condition under which the low voltage line non-selected transistor is turned on is expressed by the following equation (8).

$$VG - V1 - Vthp < 0 \tag{8}$$

In addition, Vthp<0. In the meantime, the condition under which the parasitic diode is not turned on in this low voltage line non-selected transistor is expressed by the following equation (9).

$$V1 < VB + VF \quad (9)$$

The symbol "VF" has a positive value according to the definition. By modifying the equations (8) and (9), the above equation (2) is obtained. In the present embodiment, it is sufficient to select a low voltage line non-selected transistor whose threshold voltage Vthp satisfies the above equation (2).

The above equation (2) means that VB+VF>VG−Vthp. From the selected state of the two-terminal memory cell, that is, a state where the low voltage line non-selected transistor and its parasitic diode are all turned off according to the relation of V1<VG−Vthp and V1<VB+VF, even when only the high voltage line selected transistor is turned on and the voltage V1 of the bit line BL starts to increase, VG−Vthp always becomes smaller than V1 earlier than VB+VF. That is, the low voltage line non-selected transistor is turned on before the parasitic diode is turned on. Then, the voltage V1 of the first terminal maintains the voltage of the second terminal (V2−Vthn), and does not increase further. Therefore, V1>VB+VF does not occur, and the parasitic diode remains turned off.

When it is assumed that the gate voltage VG is 0 V (=VS), it is sufficient to select a low voltage line non-selected transistor which satisfies the following equation (10).

$$Vthp < -VB - VF \quad (10)$$

Under this assumption, the voltage of the second terminal may be applied to the gate, and there is an advantage that it is not necessary to separately provide a power supply for the gate voltage.

Further, when it is assumed that the substrate voltage VB is 0 V, a low voltage line non-selected transistor satisfying the following equation (11) may be selected.

$$Vthp > -VF \quad (11)$$

As described above, for the high voltage line non-selected transistor and the low voltage line non-selected transistor (hereinafter, referred to as non-selected transistors when it is not necessary to distinguish these elements), transistors satisfying the following equations (12) and (13) are employed.

$$|Vthh| < |VG - VB| + VF \quad (12)$$

$$|Vthp| < |VG - VB| + VF \quad (13)$$

That is, the threshold voltage Vth of the non-selected transistor may be closer to 0 than the sum of the absolute value of (VG−VB) and the forward voltage VF of the parasitic diode. In other words, the absolute value of the threshold voltage Vth of the non-selected transistor may be smaller than the sum of the absolute value of (VG−VB) and the forward voltage VF of the parasitic diode.

While FIGS. 7 and 10 illustrate the example of transition from the selected state to the non-selected state at the time of writing, the same problem occurs at the time of reading. That is, there is a problem that a period occurs during which only the high voltage line selected transistor or only the low voltage line selected transistor among the four transistors of the word line selection circuit WLSEL and the bit line selection circuit BLSEL is turned on. In any case, a transistor satisfying the condition of the above equation (12) may be adopted as the high voltage line non-selected transistor, and a transistor satisfying the condition of the above equation (13) may be adopted as the low voltage line non-selected transistor.

It has been illustrated above that the word line selection circuit WLSEL includes two transistors, that is, the high voltage line selected transistor and the high voltage line non-selected transistor, and the bit line selection circuit BLSEL includes two transistors, that is, the low voltage line selected transistor and the low voltage line non-selected transistor. However, it is also possible to configure the word line selection circuit WLSEL with only one high voltage line non-selected transistor and constitute the bit line selection circuit BLSEL with one low voltage line non-selected transistor. Even in this case, in the present embodiment, a transistor satisfying the condition of the above equation (12) may be adopted as the high voltage line non-selected transistor, and a transistor satisfying the condition of the above equation (13) may be adopted as the low voltage line non-selected transistor.

Although not particularly described, the threshold voltages of the high voltage line selected transistor and the low voltage line selected transistor may be set to a threshold voltage higher than the threshold voltages of the high voltage line non-selected transistor and the low voltage line non-selected transistor. This may achieve the effect that a leak current is less likely to occur.

Figure 12:
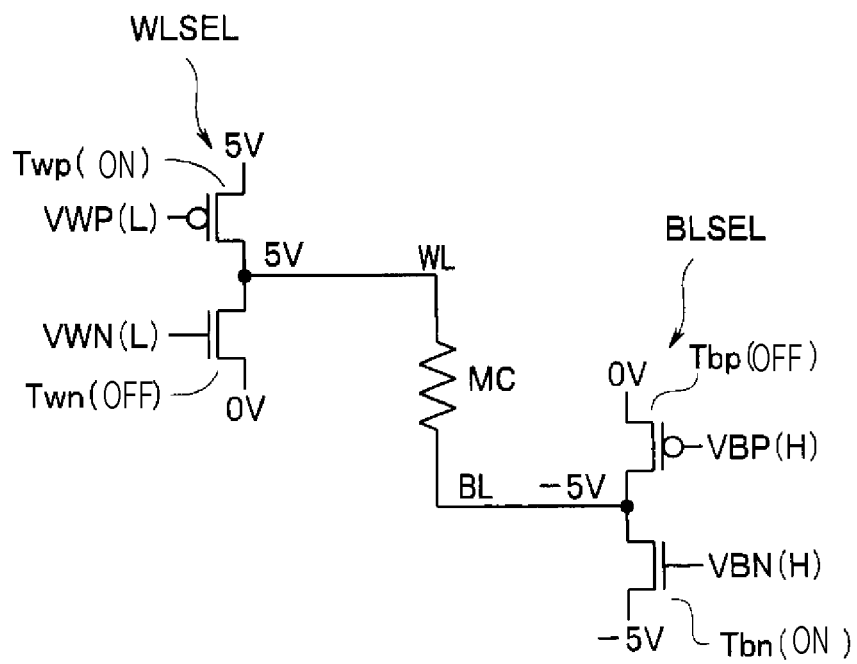
FIG. 12 is a circuit diagram illustrating an example where a two-terminal memory element MC is in a selected state.

Next, the operation of the embodiment configured as described above will be described with reference to FIGS. 12 to 14. FIG. 12 is a circuit diagram illustrating an example in which the two-terminal memory element MC is in the selected state. FIGS. 13 to 16 are circuit diagrams illustrating an example in the transition of the two-terminal memory element MC from the selected state to the non-selected state. In FIGS. 12 to 16, the states of L and H of the gate voltage and the on and off states of the respective transistors are illustrated in parentheses.

It is now assumed that write is performed on the two-terminal memory element MC of a predetermined two-terminal memory cell in the memory cell array 2 in the selected state. In this case, based on the WL selection information from the control circuit 5, the WL decoder 3 sets the word line WL connected to the two-terminal memory element MC as a selected word line, and the BL decoder 4 sets the bit line BL connected to the two-terminal memory element MC as a selected bit line. That is, based on the WL selection information, the WL decoder 3 sets the gate voltage VWP supplied to the transistor Twp of the word line selection circuit WLSEL connected to the selected word line to L, and sets the gate voltage VWN supplied to the transistor Twn to L. Based on the BL selection information, the BL decoder 4 sets the gate voltage VBN supplied to the transistor Tbn of the bit line selection circuit BLSEL connected to the selected bit line to H, and sets the gate voltage VBP supplied to the transistor Tbp to H.

Thus, as illustrated in FIG. 12, the transistors Twp and Tbn are turned on, the transistors Twn and Tbp are turned off, 5 V is applied to the word line WL, and −5 V is applied to the bit line BL, so that the two-terminal memory element MC is driven at a voltage of 10 V to perform write.

Figure 13:
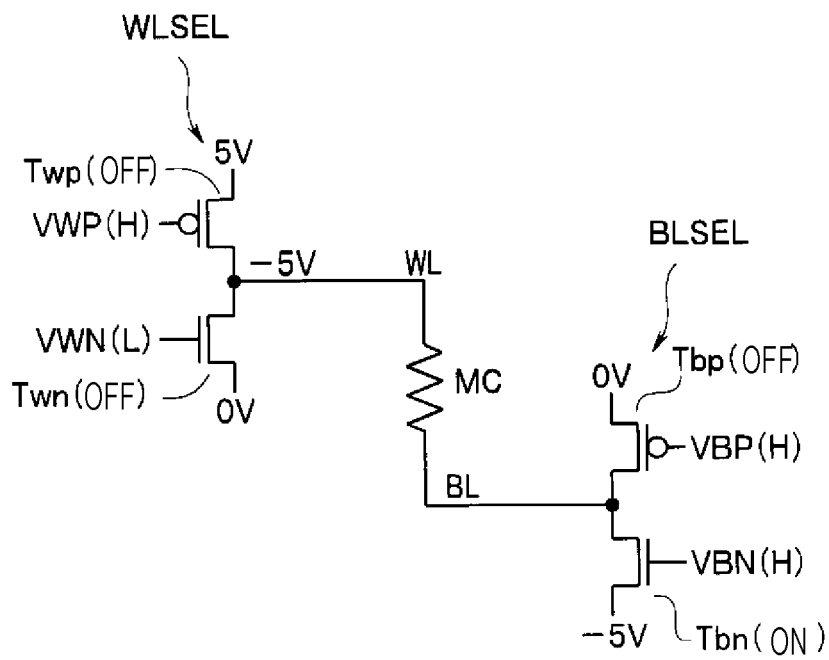
FIGS. 13-16 are conceptual diagrams illustrating two examples where the two-terminal memory element MC is changed from the selected state to a non-selected state and there is a mismatch in the timing of applying the gate voltages to the transistors of the word line selection circuit and the bit line selection circuit.

Next, it is assumed that transition from the selected state to the non-selected state in FIG. 12 is performed. The control circuit 5 outputs the WL selection information and the BL selection information to turn off all the transistors Twp, Twn, Tbp and Tbn once. As a result, L and H of the gate voltages VWN and VBP do not change, the gate voltage VWP changes from L to H, and the gate voltage VBN changes from H to L. In this case, as in FIG. 9, it is assumed that the change of the gate voltage VBN from H to L is delayed from the change of the gate voltage VWP due to the timing control deviation. In this case, as illustrated in FIG. 13, a period occurs in which only the transistor Tbn is turned on.

Figure 14:
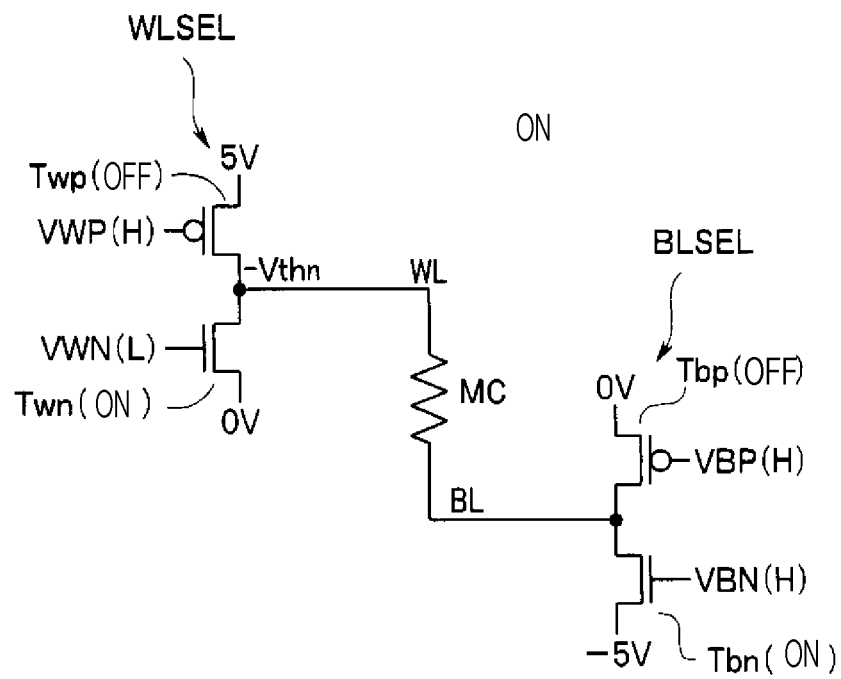

Then, the voltage of the word line WL is lowered by −5 V applied to the second terminal of the transistor Tbn. That is, the voltage of the first terminal of the transistor Twn which is a high voltage line non-selected transistor is lowered. As a result, VG−Vthn becomes larger than the voltage V1 of the first terminal, and as illustrated in FIG. 14, even when the gate voltage VWN is at L, the channel of the transistor Twn is conductive and turned on. As a result, a current flows from the second terminal of the transistor Twn to the second terminal of the transistor Tbn via the channel of the transistor Twn, the word line WL, the two-terminal memory element MC, the bit line BL and the transistor Tbn.

As a result, when VWN is 0 V, the voltage of the first terminal of the transistor Twn becomes −Vthn. This voltage is higher than VB−VF, and no parasitic diode current occurs in the parasitic diode of the transistor Twn. Thereafter, when the gate voltage VBN changes from H to L, the transistor Tbn is turned off, and the transistor Twn is also turned off.

In the non-selected state, the gate voltages VWP and VWN are at H, and the gate voltages VBP and VBN are at L. That is, in the non-selected state, the transistors Twn and Tbp are turned on, and the transistors Twp and Tbn are turned off. As a result, 0 V is applied to both the word line WL and the bit line BL, and the two-terminal memory element MC is in the non-selected state.

Figure 15:
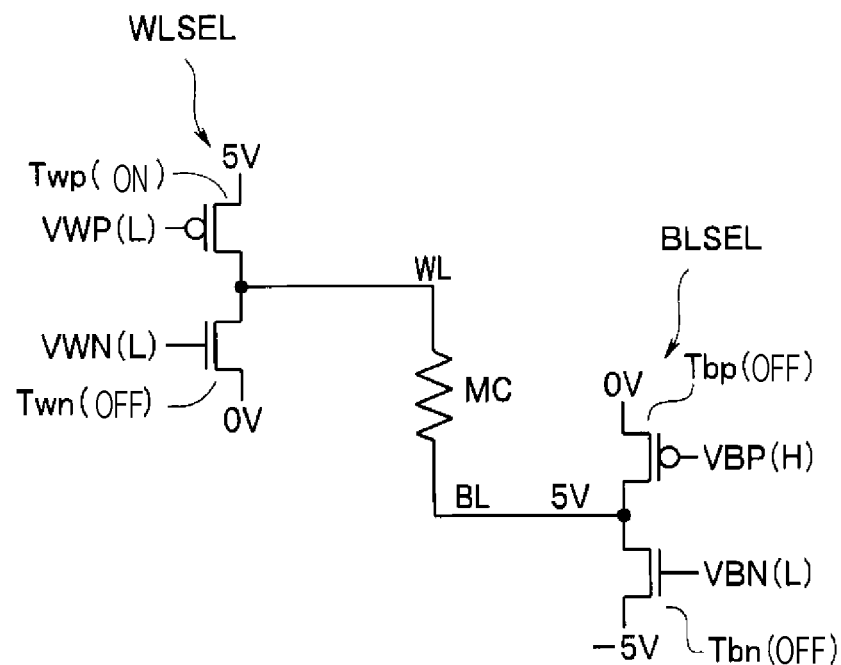

Next, at the time of transition from the selected state to the non-selected state, it is assumed that the change of the gate voltage VBN from H to L is faster than the change of the gate voltage VWP due to the reverse state of FIG. 9, that is, the timing control deviation. In this case, as illustrated in FIG. 15, a period occurs in which only the transistor Twp is turned on.

Figure 16:
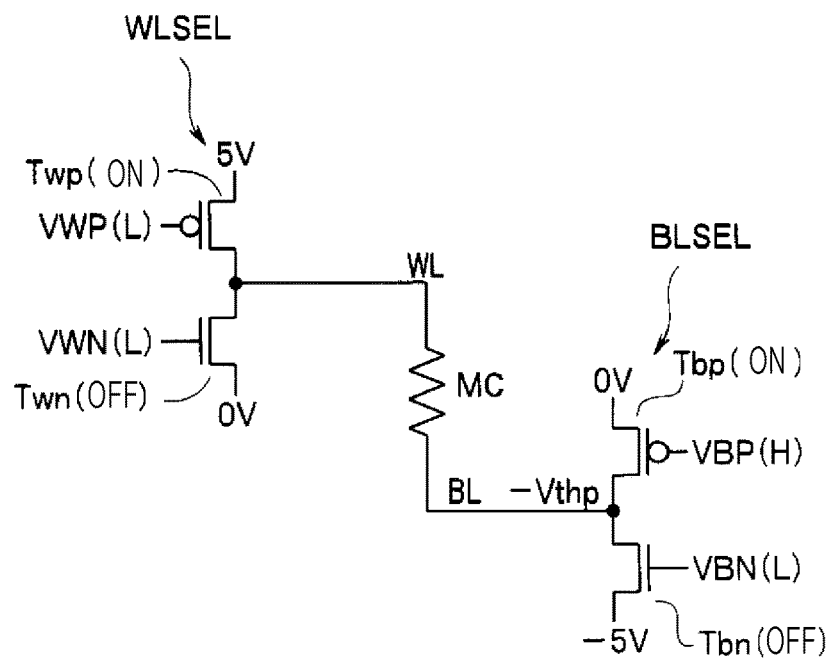

Then, the voltage of the bit line BL increases by 5 V applied to the second terminal of the transistor Twp. That is, the voltage of the first terminal of the transistor Tbp which is a low voltage line non-selected transistor rises. As a result, VG−Vthp becomes smaller than the voltage V1 of the first terminal, and as illustrated in FIG. 16, even when the gate voltage VBP is at H, the channel of the transistor Tbp is conductive and turned on. As a result, the current flows from the second terminal of the transistor Twp to the second terminal of the transistor Tbp via the channel of the transistor Twp, the word line WL, the two-terminal memory element MC, the bit line BL and the transistor Tbp.

As a result, when VBP is 0 V, the voltage of the first terminal of the transistor Tbp becomes −Vthp. This voltage is smaller than VB+VF, and no parasitic diode current occurs in the parasitic diode of the transistor Tbp. Thereafter, when the gate voltage VWP changes from H to L, the transistor Twp is turned off, and the transistor Tbp is also turned off.

Even in this case, in the non-selected state, the gate voltages VWP and VWN are at H, and the gate voltages VBP and VBN are at L. That is, in the non-selected state, the transistors Twn and Tbp are turned on, and the transistors Twp and Tbn are turned off. As a result, 0 V is applied to both the word line WL and the bit line BL, and the two-terminal memory element MC is in the non-selected state.

In this manner, in the present embodiment, the threshold voltage of the MOS transistor for applying a voltage to the two-terminal memory cell is set based on the forward voltage of the parasitic diode, so that generation of the parasitic diode current may be reliably prevented regardless of the timing deviation of the transition between the selected state and the non-selected state. In addition, an element used in the WL word line decoder 3 and the BL bit line decoder 4 is not necessary to have a high breakdown voltage as compared with the case when the bias voltage is applied to the substrate to prevent the parasitic diode current. For example, it is possible to employ a transistor whose breakdown voltage is smaller than a difference between a possible maximum voltage applied to the high voltage line and a possible maximum voltage applied to the low voltage line.

Figure 17:
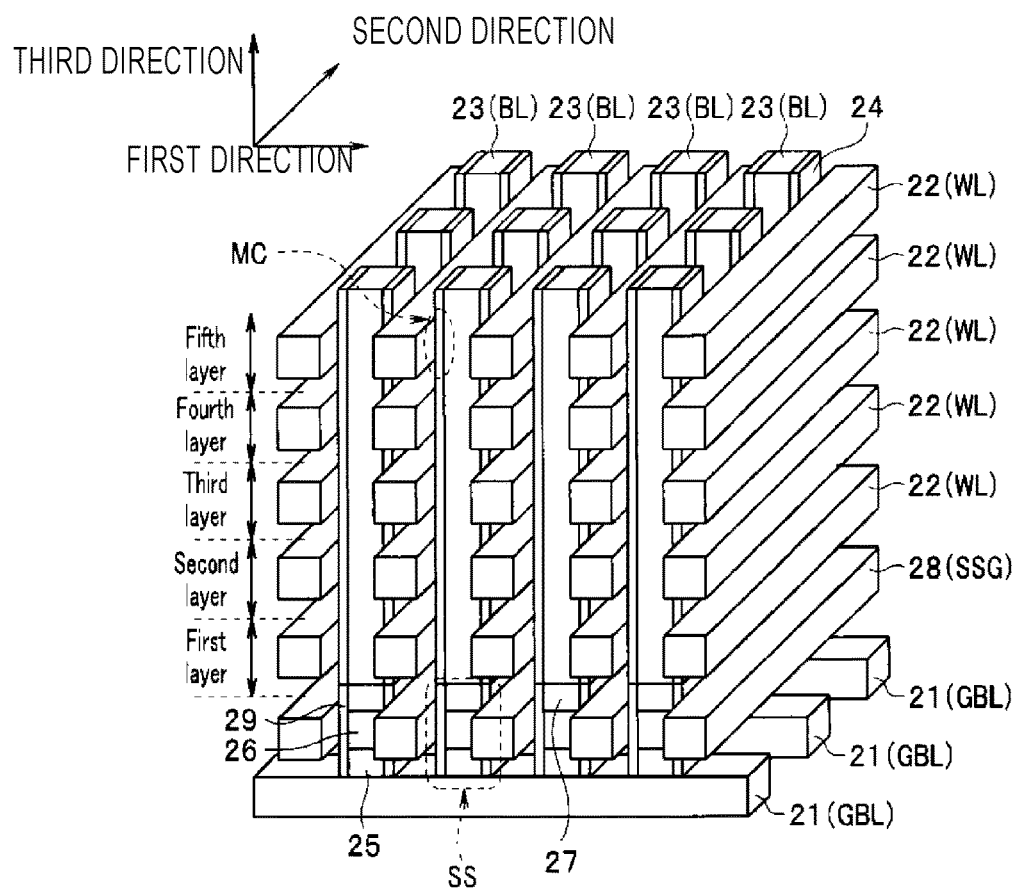
FIG. 17 is an explanatory view illustrating another example of the memory cell array.

Without being limited to the cross-point type memory illustrated in FIG. 2, the above embodiment may employ a memory cell array in which two-terminal memory cells are arranged three-dimensionally as illustrated in FIG. 17. FIG. 17 is an explanatory view illustrating another example of the memory cell array.

The memory cell array illustrated in FIG. 17 is provided with plural global column lines 21, row lines 22, and column lines 23. The plural global column lines 21 are formed in parallel along the first direction, and are arranged, for example, in the lowermost layer of the memory cell array. The plural row lines 22 are formed in parallel along the second direction orthogonal to the first direction, and are provided at a higher position than the global column line 21 in the third direction crossing the first and second directions. Layers of the plural row lines 22 are provided in the third direction (the normal direction of a surface on which the global column lines 21 are arranged).

The column lines 23 extend along the third direction between the adjacent row lines 22 and are arranged in the first and second directions. One end (lower end) of a column line 23 is electrically connected to any one of the global column lines 21. More specifically, in the two-dimensional plane formed in the first direction and the second direction, the column lines 23 arranged in the same column along the first direction are electrically connected to the same global column lines 21.

The two-terminal memory element MC including a variable resistor element is formed between each row line and each column line 23. In the present example, a resistance change material 24 is formed on the entire surface (surface facing the row line 22) of the side of the column line 23. A portion of the resistance change material 24 disposed between the column line 23 and the row line 22 functions as a memory cell MC.

The resistance change material 24 in this example is provided on two side surfaces (opposed to the row line 22) facing the first direction out of two opposing sets of side surfaces of the column line 23, and is not provided on two side surfaces (not opposed to the row line 22) facing the second direction.

A selection element SS is provided between a global column line 21 and the corresponding column line. The selection element SS is, for example, a FET (Field Effect Transistor). Here, the FET may be referred to as a "selection FET". In this case, the selection element SS includes a source region 25 formed on the global column line 21, a semiconductor layer (which provides a channel region) formed on a source region 25, and a drain region 27 formed on the semiconductor layer 26. The semiconductor layer 26 is, for example, a silicon layer.

Further, a selection gate line (selection gate electrode of the selection FET) 28 is formed between adjacent semiconductor layers 26 along the second direction. The selection gate line 28 is arranged in parallel with the row line 22. Furthermore, a gate insulating layer 29 is formed between the selection gate line 28 and the semiconductor layer 26.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first selection circuit including a first MOS transistor having a first terminal connected to a high voltage line that is connected to a first end of a two-terminal memory element and a second terminal connected to a first power supply voltage terminal, and a second MOS transistor having a first terminal connected to the high voltage line and a second terminal connected to a second power supply voltage terminal; and
a second selection circuit including a third MOS transistor having a first terminal connected to a low voltage line that is connected to a second end of the two-terminal memory element and a second terminal connected to a third power supply voltage terminal and a fourth MOS transistor having a first terminal connected to the low voltage line and a second terminal connected to a fourth power supply voltage terminal,
wherein each of the second and fourth MOS transistors satisfy the condition of |Vth|<|VG−VB|+VF, where Vth is a threshold voltage thereof, VG is a voltage difference between a gate thereof and the second terminal thereof, VB is a bias voltage applied to a body thereof, and VF is a minimum voltage at which a parasitic diode that is between the body thereof and the first terminal thereof is turned on.

2. The semiconductor memory device according to claim 1, further comprising:
a power supply circuit configured to apply first, second, third, and fourth voltages to the first, second, third, and fourth power supply voltage terminals, respectively.

3. The semiconductor memory device according to claim 2, wherein the first voltage is higher than a ground voltage and the third voltage is lower than the ground voltage.

4. The semiconductor memory device according to claim 3, wherein the second and fourth voltages are each at the ground voltage.

5. The semiconductor memory device according to claim 4, wherein the first and fourth MOS transistors are each a PMOS transistor and the second and third MOS transistors are each an NMOS transistor.

6. The semiconductor memory device according to claim 1, wherein a threshold voltage of the first and third MOS transistors is higher than a threshold voltage of the second and fourth MOS transistors.

7. A semiconductor memory device comprising:
a first selection circuit including a first MOS transistor having a first terminal connected to a high voltage line that is connected to a first end of a two-terminal memory element and a second terminal connected to a first power supply voltage terminal, and a second MOS transistor having a first terminal connected to the high voltage line and a second terminal connected to a second power supply voltage terminal;
a second selection circuit including a third MOS transistor having a first terminal connected to a low voltage line that is connected to a second end of the two-terminal memory element and a second terminal connected to a third power supply voltage terminal and a fourth MOS transistor having a first terminal connected to the low voltage line and a second terminal connected to a fourth power supply voltage terminal;
a power supply circuit configured to generate first and second voltages and apply the first and second voltages to the first and second power supply voltage terminals, respectively, and generate third and fourth voltages and apply the third and fourth voltages to the third and fourth power supply voltage terminals, respectively; and
a control circuit configured to control the first, second, third, and fourth transistors during a read operation or a write operation performed on the memory element, wherein
each of the second and fourth MOS transistors satisfy the condition of |Vth|<|VG−VB|+VF, where Vth is a threshold voltage thereof, VG is a voltage difference between a gate thereof and the second terminal thereof, VB is a bias voltage applied to a body thereof, and VF is a minimum voltage at which a parasitic diode that is between the body thereof and the first terminal thereof is turned on.

8. The semiconductor memory device according to claim 7, further comprising:
a plurality of word lines extending in a first direction; and
a plurality of bit lines over the word lines and extending in a second direction that intersects the first direction, wherein the memory element is located between one of the word lines corresponding to the high voltage line and one of the bit lines corresponding to the low voltage line.

9. The semiconductor memory device according to claim 8, further comprising:
a plurality of memory elements arranged in a plane that is parallel to the first and second directions and is between the word lines and the bit lines, and at locations where the bit lines overlap the word lines.

10. The semiconductor memory device according to claim 9, wherein the first voltage is higher than a ground voltage and the third voltage is lower than the ground voltage.

11. The semiconductor memory device according to claim 10, wherein the second and fourth voltages are each at the ground voltage.

12. The semiconductor memory device according to claim 11, wherein the first and fourth MOS transistors are each a PMOS transistor and the second and third MOS transistors are each an NMOS transistor.

13. The semiconductor memory device according to claim 7, wherein a threshold voltage of the first and third MOS transistors is higher than a threshold voltage of the second and fourth MOS transistors.

14. A method of transitioning a memory element of a semiconductor memory device from a selected state to a non-selected state, wherein the semiconductor memory device includes:
a first selection circuit including a first MOS transistor having a first terminal connected to a high voltage line that is connected to a first end of the memory element and a second terminal connected to a first power supply voltage terminal, and a second MOS transistor having a first terminal connected to the high voltage line and a second terminal connected to a second power supply voltage terminal; and
a second selection circuit including a third MOS transistor having a first terminal connected to a low voltage line that is connected to a second end of the memory element and a second terminal connected to a third power supply voltage terminal and a fourth MOS transistor having a first terminal connected to the low voltage line and a second terminal connected to a fourth power supply voltage terminal, said method comprising:

selecting the memory element by turning on the first and third transistors and turning off the second and fourth transistors;

while the second and fourth transistors are turned off, turning off the first and third transistors at different timings to cause a parasitic diode current to be generated in a body of one of the second and fourth transistors; and while blocking the parasitic diode current that is generated in the body of said one of the second and fourth transistors from flowing to the second terminal of said one of the second and fourth transistors, transitioning the memory element to the non-selected state by turning on the second and fourth transistors.

15. The method according to claim 14, wherein when the turning off of the third transistor is delayed with respect to the turning off of the first transistor, the parasitic diode current generated in the body of the second transistor is blocked from flowing to the second terminal of the second transistor.

16. The method according to claim 14, wherein when the turning off of the first transistor is delayed with respect to the turning off of the third transistor, the parasitic diode current generated in the body of the fourth transistor is blocked from flowing to the second terminal of the fourth transistor.

17. The method according to claim 14, wherein the first and fourth MOS transistors are each a PMOS transistor and the second and third MOS transistors are each an NMOS transistor.

18. The method according to claim 14, further comprising:

generating first, second, third, and fourth voltages to be applied to the first, second, third, and fourth power supply voltage terminals, respectively, wherein the first voltage is higher than a ground voltage and the third voltage is lower than the ground voltage.

19. The method according to claim 18, wherein the second and fourth voltages are each at the ground voltage.

20. The method according to claim 14, wherein the semiconductor memory device further includes a plurality of word lines extending in a first direction, and a plurality of bit lines over the word lines and extending in a second direction that intersects the first direction, and the memory element is located between one of the word lines corresponding to the high voltage line and one of the bit lines corresponding to the low voltage line.

* * * * *